United States Patent
McClure et al.

(10) Patent No.: US 7,513,682 B2
(45) Date of Patent: Apr. 7, 2009

(54) TEMPERATURE MONITORING SYSTEM

(75) Inventors: Linden H. McClure, Millikan, CO (US); Shane R. Ward, Loveland, CO (US); Mark J. Jedrzejewski, Thornton, CO (US); Makarand P. Gore, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 592 days.

(21) Appl. No.: 10/842,831

(22) Filed: May 11, 2004

(65) Prior Publication Data

US 2005/0254551 A1    Nov. 17, 2005

(51) Int. Cl.
*G01N 25/72* (2006.01)
*G01K 11/00* (2006.01)

(52) U.S. Cl. .............................. 374/5; 374/4; 374/162; 252/962; 252/408.1

(58) Field of Classification Search ............... 374/4, 374/5, 162; 252/408.1, 962
See application file for complete search history.

(56) References Cited

U.S. PATENT DOCUMENTS

| | | | | |
|---|---|---|---|---|
| 3,658,543 A | | 4/1972 | Gerlach, Jr. et al. | |
| 3,845,662 A | * | 11/1974 | Surgina et al. | 116/217 |
| 3,874,240 A | * | 4/1975 | Rembaum | 374/162 |
| 4,101,690 A | * | 7/1978 | Miyamoto et al. | 503/201 |
| 4,138,357 A | * | 2/1979 | Igarashi | 374/162 |
| 4,142,151 A | | 2/1979 | Hansen | |
| 4,170,190 A | | 10/1979 | Warner | |
| 4,601,588 A | * | 7/1986 | Takahara et al. | 374/106 |
| 4,620,941 A | * | 11/1986 | Yoshikawa et al. | 252/408.1 |
| 4,682,857 A | | 7/1987 | Tan | |
| 4,732,810 A | * | 3/1988 | Kito et al. | 428/402.2 |
| 4,835,475 A | | 5/1989 | Hanakura et al. | |
| 4,835,476 A | | 5/1989 | Kurosawa | |
| 4,838,664 A | * | 6/1989 | Graham | 349/199 |
| 4,891,250 A | * | 1/1990 | Weibe et al. | 374/162 |
| 4,917,503 A | * | 4/1990 | Bhattacharjee | 374/102 |
| 5,294,374 A | | 3/1994 | Martinez et al. | |
| 5,480,482 A | * | 1/1996 | Novinson | 106/498 |
| 5,543,382 A | | 8/1996 | Watanabe et al. | |
| 5,558,700 A | * | 9/1996 | Shibahashi et al. | 106/31.15 |
| 5,672,560 A | * | 9/1997 | Rush | 503/209 |
| 5,673,028 A | | 9/1997 | Levy | |
| 6,015,896 A | | 1/2000 | Mistry et al. | |

(Continued)

FOREIGN PATENT DOCUMENTS

EP    0 716 135    9/1999

(Continued)

OTHER PUBLICATIONS

H. Bouas-Laurent et al., "Organic Photochromism" (IUPAC Technical Report), Pure Appl. Chem., vol. 73, No. 4, pp. 639-665, 2001.

(Continued)

*Primary Examiner*—Gail Verbitsky
*Assistant Examiner*—Mirellys Jagan

(57) ABSTRACT

Disclosed herein is a temperature monitoring system including a circuit board and a thermochromic coating covering at least a portion of the circuit board, wherein the thermochromic coating is capable of indicating a temperature gradient on the circuit board. The thermochromic coating may comprise a color forming leuco dye, an activator, and optionally a deprotecting agent.

22 Claims, 2 Drawing Sheets

U.S. PATENT DOCUMENTS

| | | | |
|---|---|---|---|
| 6,017,981 A | 1/2000 | Hugo | |
| 6,022,648 A | 2/2000 | Jacobson et al. | |
| 6,025,486 A | 2/2000 | Mistry et al. | |
| 6,137,669 A | 10/2000 | Chiang et al. | |
| 6,251,571 B1 | 6/2001 | Dessauer et al. | |
| 6,407,560 B1 | 6/2002 | Walraven et al. | |
| 6,486,473 B2 | 11/2002 | Salapow et al. | |
| 6,488,405 B1 * | 12/2002 | Eppes et al. | 374/5 |
| 6,549,025 B1 | 4/2003 | Tubera et al. | |
| 2002/0045548 A1 | 4/2002 | Saito | |
| 2002/0089580 A1 | 7/2002 | Suzuki et al. | |
| 2002/0183203 A1 | 12/2002 | Hoefs et al. | |
| 2003/0003399 A1 | 1/2003 | Muller et al. | |
| 2005/0053748 A1 * | 3/2005 | Gore et al. | 428/64.4 |

FOREIGN PATENT DOCUMENTS

| | | | | |
|---|---|---|---|---|
| JP | 58022930 A | * | 2/1983 |
| JP | 63027587 A | * | 2/1988 |
| JP | 63244652 A | * | 10/1988 |
| JP | 01157501 A | * | 6/1989 |
| JP | 04342193 A | * | 11/1992 |
| JP | 05107212 A | * | 4/1993 |

OTHER PUBLICATIONS

"Protected Activators For Use In Leuco Dye Compositions," U.S. Appl. No. 10/656,735, filed Sep. 5, 2003, Hewlett-Packard Company, pp. 1-28.

"Metal Salt, Activators For Use In Leuco Dye Compositions," U.S. Appl. No. 10/656,539, filed Sep. 5, 2003, Hewlett-Packard Company, pp. 1-30.

* cited by examiner

TEMPERATURE MONITORING SYSTEM

BACKGROUND

Thermal image analysis may be used to identify electronic components with abnormal thermal characteristics, as well as to verify that components are operating within their specifications. For proven circuit designs, abnormal thermal characteristics are indicative of integrated circuit (IC) failure or board artwork defects. In new designs, thermal image analysis can be used to locate underspecified components or poorly designed ventilation.

Thermal image analysis may require the use of sophisticated hardware. The hardware, however, may be too sophisticated and cumbersome for use in every situation that may be encountered in the field by a field engineer. Thus, there remains a need for improvements in thermal analysis of electronic devices.

SUMMARY

Disclosed herein is a temperature monitoring system. Some of the exemplary embodiments may comprise a circuit board and a thermochromic coating covering at least a portion of the circuit board, wherein the thermochromic coating indicates areas of increased temperature on the circuit board. The thermochromic coating may comprise a color forming leuco dye, an activator, and a deprotecting agent. The thermochromic coating also may comprise a color forming leuco dye and an activator carried in different phases in a matrix.

BRIEF DESCRIPTION OF THE DRAWINGS

For a detailed description of embodiments of the invention, reference will now be made to the accompanying drawings in which.

NOTATION AND NOMENCLATURE

Figure 2:
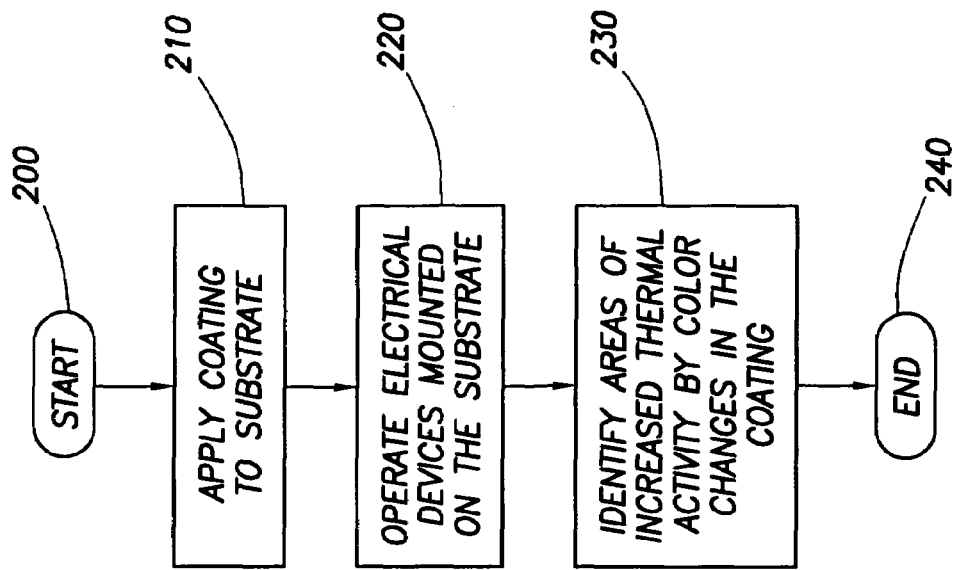
FIG. 2 shows a flow diagram in accordance with embodiments of the invention.

Certain terms are used throughout the following description and claims to refer to particular system components. As one skilled in the art will appreciate, companies may refer to components by different names. This document does not intend to distinguish between components that differ in name but not function. In the following discussion and in the claims, the terms "including" and "comprising" are used in an open-ended fashion, and thus should be interpreted to mean "including, but not limited to . . . ."

The term "thermochromic" refers to a device or substance that exhibits thermally induced color change. The color change may be permanent (irreversible) or reversible.

As used herein, the term "color forming composition" comprises a leuco dye, an activator having a protection leaving group, and a deprotecting agent. These three components can work together, upon exposure to heat, to provide color to the leuco dye. Additionally, the color forming composition in combination with "liquid carrier" forms a "coating composition."

As used herein, "leuco dye" refers to a dye which, prior to development, is in a leuco form which is substantially colorless or white, and which reacts with an activator upon exposure to energy in the form of heat or light to form a colored dye. The color-altering phenomenon may be due to a chemical change, such as through oxidation, resulting from heat exposure. The term "color" can be any change in visible absorbance that occurs upon leuco dye development, for example development of black, white, and other colors.

The term "protection leaving group" refers to any moiety which can be used to block the reaction of a functional group and which can be removed, as desired, to expose or deprotect a functional group of an activator. Protection leaving groups can be non-reactive with respect to other components of the color forming composition. Thus, the protection leaving group may not comprise reactive groups which react outside of the protecting and deprotecting mechanism described in more detail below.

The term "activator" refers to a compound that is reactive with leuco dyes. In some embodiments, the activator is reactive with the leuco dyes upon introduction of energy in the form of light and/or heat.

The term "protected activator" refers to the combination of an activator and a protection leaving group which may be attached to the functional group(s) of the activator. In other embodiments, the activator is reactive with the leuco dyes in the absence of externally supplied energy.

The term "deprotecting agent" refers to a compound which reacts with the protection leaving group to expose a functional group of an activator for reaction with a leuco dye. Deprotecting agents can be sensitive to exposure to a predetermined amount of energy in the form of heat or light.

As used herein, "developing" or "development" refers to the interaction or reaction of a leuco dye with an activator to produce a visible composition having a desired color.

As used herein, "liquid carrier" and "binder" are interchangeable and refer to any liquid or solid material capable of forming a matrix with the color forming composition. For example, the term "spin-coatable composition" may comprise a liquid carrier having various components dissolved or dispersed therein. In some embodiments, the spin-coatable composition can comprise a color forming composition in a liquid carrier. Coating compositions can be spin-coatable in one embodiment, or can be configured for other application methods as well e.g., printing such as offset, inkjet, gravure, or roller coating.

As used herein, "protonic acid" refers to an acid, which ionizes in aqueous solution to liberate hydrogen ions. Protonic acids may comprise, but are not limited to, hydrochloric acid, sulfuric acid, phosphoric acid, and/or fluoric acid.

DETAILED DESCRIPTION

The following discussion is directed to various embodiments of the invention. The embodiments disclosed should not be interpreted, or otherwise used, as limiting the scope of the disclosure. In addition, one skilled in the art will understand that the following description has broad application, and the discussion of any embodiment is meant only to be exemplary of that embodiment, and not intended to intimate that the scope of the disclosure is limited to that embodiment.

Embodiments of the present invention comprise thermochromic coatings on substrates or surfaces such as electronic circuit boards. The coatings identify areas of localized (usually increased) temperature variation on the surface. In accordance with embodiments of the present invention, the thermochromic coating may comprise one or more color forming compositions and a liquid carrier. The color forming composition may comprise a leuco dye, a protected activator, and a deprotecting agent. The protected activators may comprise an activator having at least one acid group and a protection leaving group chemically attached to the at least one acid group. Upon application of energy in the form of heat or light, the protection leaving group reacts with the deprotecting agent, thereby exposing the functional acid group(s) of the activator. The unprotected activator can then react with the leuco dye to form a colored dye.

Other embodiments comprise a multiple phase coating in which one of a leuco dye and an activator is dissolved in a matrix and the other is present in the matrix as undissolved particles. Upon the application of heat (i.e., by an overheating circuit), the undissolved particles begin to melt and react with the dissolved compound to change color.

Other embodiments may include multiple color formers having different properties (e.g. different glass transition temperatures or different melting temperatures) such that an observer can tell the degree of overheating by observing the type of color change that occurs.

Activators

The following examples illustrate several mechanisms for protecting an acid activator. Phenolic and catechol activators can be protected by acylation and condensation reactions with an acyl chloride, acyl anhydride, or activated ester (e.g., succinimidyl ester). Such acylation and condensation reactions can be performed in the presence of a base, such as NaOH, or by heating. Alternatively, the reaction can be performed by mixing an amine such as triethyl amine with a dipolar aprotic solvent (e.g., acetonitrile or dioxane) followed by an aqueous work up (addition of water and subsequent extraction of the protected activator using ether) or evaporation and purification.

More specifically, the activators employed in some embodiments can contain various functional groups (e.g., hydroxy, thio and amine groups), which act as a Lewis acid. After the protection leaving group reacts with the functional group, the resulting protected activator can be an ester, ether, sulfonate, carbonate, carbamate, or phosphinate. Several specific protected activators comprise trifluoroacetate, 2-trimethylsilyl ethyl ester, t-butyl ester, p-nitrobenzyl ester, nitrobutyl ester, and trichloroethyl ester.

Examples of acidic materials that can be used as activators in embodiments of the present invention comprise phenols, carboxylic acids, cyclic sulfonamides, protonic acids, and compounds having a pKa of less than about 7.0, and mixtures thereof. Phenolic and carboxylic activators may comprise boric acid, oxalic acid, maleic acid, tartaric acid, citric acid, succinic acid, benzoic acid, stearic acid, gallic acid, salicylic acid, 1-hydroxy-2-naphthoic acid, o-hydroxybenzoic acid, m-hydroxybenzoic acid, 2-hydroxy-p-toluic acid, 3,5-xylenol, thymol, p-t-butylphenyl, 4-hydroxyphenoxide, methyl-4-hydroxybenzoate, 4-hydroxyacetophenone, a-naphthol, naphthols, catechol, resorcin, hydroquinone, 4-t-octylcatechol, 4,4'-butylidenephenol, 2,2'-dihydroxydiphenyl, 2,2'-methylenebis (4-methyl-6-t-butyl-phenol), 2,2'-bis(4'-hydroxyphenyl) propane, 4,4'-isopropylidenebis(2-t-butylphenol), 4,4'-secbutylidenediphenol, pyrogallol, phloroglucine, phlorogluocinocarboxylic acid, 4-phenylphenol, 2,2'-methylenebis(4-chlorophenyl), 4,4'-isopropylidenediphenol, 4,4'-isopropylidenebis(2-chlorophenol), 4,4'-isopropylidenebis(2-methylphenol), 4,4'-ethylenebis(2-methylphenol), 4,4'-thiobis(6-t-butyl-3-methylphenol), bisphenol A and its derivatives (such as 4,4'-isopropylidenediphenol (bisphenol A), 4-4'-cyclohexylidenediphenol, p,p'-(1-methyl-n-hexylidene) diphenol, 1,7-di(4-hydroxyphenylthio)-3,5-dioxaheptane), 4-hydroxybenzoic esters, 4-hydroxyphthalic diesters, phthalic monoesters, bis(hydroxyphenyl)sulfides, 4-hydroxyarylsulfones, 4-hydroxyphenylarylsulfonates, 1,3-di[2-(hydroxyphenyl)-2-propylbenzenes, 1,3-dihydroxy-6(a,a-dimethylbenzyl)benzene, resorcinols, hydroxybenzoyloxybenzoic esters, bisphenolsulfones, bis-(3-allyl-4-hydroxyphenyl)sulfone (TG-SA), bisphenolsulfonic acids, 2,4-dihydroxy-benzophenones, novolac type phenolic resins, polyphenols, saccharin, 4-hydroxy-acetophenone, p-phenylphenol, benzyl-p-hydroxybenzoate (benzalparaben), 2,2-bis(p-hydroxyphenyl) propane, p-tert-butylphenol, 2,4-dihydroxy-benzophenone, and p-benzylphenol.

In some embodiments, the activator is a phenol compound. More particularly, the activator may be a bisphenol such as TG-SA. Further, the activator compound may be a carboxylic acid selected from the group consisting of boric acid, oxalic acid, maleic acid, tartaric acid, citric acid, succinic acid, benzoic acid, stearic acid, gallic acid, salicylic acid, ascorbic acid, and mixtures thereof.

Protection Leaving Groups

As mentioned above, the functional groups of the activators are protected by a protection leaving group. In one aspect, the protection leaving group provides a mechanism for protecting the acid functional group of the activator. If the functional group of the activator is a hydroxy group, suitable protecting groups may comprise, for example, esters, sulfonates, ethers, phosphinates, carbonates, carbamates (i.e., esters of carbamic acid), and mixtures thereof. In some embodiments, the protection leaving group is an acyl group.

A variety of ethers can be used as protection leaving groups (e.g., silyl ethers, alkyl ethers, aromatic ethers, and mixtures thereof). Several non-limiting examples of ethers suitable for use comprise methyl ether, 2-methoxyethoxymethyl ether (MEM), cyclohexyl ether, o-nitrobenzyl ether, 9-anthryl ether, tetrahydrothiopyranyl, tetrahydrothiofuranyl, 2-(phenylselenyl)ethyl ether, benzyloxymethyl ethers, methoxyethoxymethyl ethers, 2-(trimethylsilyl)ethoxymethyl ether, methylthiomethyl ether, phenylthiomethyl ether, 2,2-dichloro-1,1-difluoroethyl ether, tetrahydropyranyl, phenacyl, phenylacetyl, propargyl, p-bromophenacyl, cyclopropylmethyl ether, allyl ether, isopropyl ether, t-butyl ether, benzyl ether, 2,6-dimethylbenzyl ether, 4-methoxybenzyl ether, o-nitrobenzyl ether, 2-bromoethyl ether, 2,6-dichlorobenzyl ether, 4-(dimethylaminocarbonyl)benzyl ether, 9-anthrymethyl ether, 4-picolyl ether, heptafluoro-p-tolyl ether, tetrafluoro-4-pyridyl ether, silyl ethers (e.g., trimethylsilyl, t-butyldimethylsilyl, t-butyidiphenylsilyl, tribenzylsilyl, triisopropylsilyl, isopropyldimethylsilyl, 2-trimethylsilyl, 2-(trimethylsilyl) ethoxymethyl (SEM) ether, and mixtures thereof.

Several examples of esters suitable for use comprise formate ester, acetate ester, isobutyrate ester, levulinate ester, pivaloate ester, aryl pivaloate esters, aryl methanesulfonate esters, adamantoate ester, benzoate ester, 2,4,6-trimethylbenzoate (mesitoate) ester, 2-trimethyl silyl ester, 2-trimethylsilyl ethyl ester, t-butyl ester, p-nitrobenzyl ester, nitrobutyl ester, trichloroethyl ester, any alkyl branched or aryl substituted ester, 9-fluorenecarboxylate, xanthene-carboxylate, and mixtures thereof. In some embodiments, the protection leaving group can be formate, acetate, isobutyrate, levulinate, pivaloate, and mixtures thereof.

Several examples of carbonates and carbamates suitable for use comprise 2,2,2-trichloroethyl carbonate, vinyl carbonate, benzyl carbonate, methyl carbonate, p-nitrophenyl carbonate, p-nitrobenzyl carbonate, S-benzyl thiocarbonate, N-phenylcarbamate, 1-adamantyl carbonate, t-butyl carbonate, 4-methylsulfinylbenzyl, 2,4-dimethylbenzyl, 2,4-dimethylpent-3-yl, aryl carbamates, methyl carbamate, benzyl carbamate, cyclic borates and carbonates, and mixtures thereof.

Several examples of phosphinates suitable for use comprise dimethylphosphinyl, dimethylthiophosphinyl, dimethylphosphinothioyl, diphenylphosphothioyl, and mixtures thereof.

Several examples of sulfonates suitable for use comprise methanesulfonate, toluenesulfonate, 2-formylbenzenesulfonate, and mixtures thereof.

Exemplary protecting groups for hydroxyl functional groups of activators comprise t-butyloxycarbonyl, allyloxycarbonyl, benzyloxycarbonyl, o-nitrobenzyloxycarbonyl, and trifluoroacetate.

The color forming compositions of embodiments of the present invention may comprise from about 6% to about 45% by weight of protected activator. In other embodiments, the protected activator can be present from about 20% and about 40% by weight. In a further detailed aspect, the protected activator can be present at from about 25% to about 38% by weight.

Deprotecting Agents

A deprotecting agent can also be included in the color forming composition and may be configured to remove the protection leaving group upon application of heat. The deprotecting agent may provide a mechanism for removing the protection leaving groups via a chemical reaction. The chemistry of some protection leaving groups does not always require a separate deprotecting agent. In some instances, the protection leaving group can be removed by the addition of heat, however, use of deprotecting agents are considered to improve the stability and development of the leuco dyes.

Deprotecting agents suitable for use may comprise amines, for example, alpha-hydroxy amines, primary amines and secondary amines. In some embodiments the deprotecting agent may be valoneol, prolinol, 2-hydroxy-1-amino-propanol, 2-amino-3-phenyl-1-propanol, (R)-(−)-2-phenyl glycinol, 2-amino-phenylethanol, 1-naphthylethyl amine, 1-aminonaphthalene, morpholin, and the like. In other embodiments, the deprotecting agent can be 2-hydroxy-1-amino-propanol. In yet other embodiments, suitable deprotecting agents may comprise amines such as those melting between 35° C. to 175° C. including 2-amino-3-phenyl-1-propanol, (R)-(−)-2-phenyl glycinol, 2-amino-phenylethanol, or such as those boiling between 80° C. and 310° C. including 1-naphthyl ethyl amine, 1-aminonaphthalene, morpholin, etc.

The deprotecting agent can be present at any concentration that is sufficient to react with enough protection leaving groups to allow a visible color change in the leuco dye. The concentration of deprotecting agent can be, for example, tailored to affect the speed and degree of the reaction upon exposure to heat. However, the deprotecting agent to activator molar ratio can be from about 10:1 to about 1:4, and more particularly may be from about 1:1 to about 1:2.

Leuco Dyes

Substantially any leuco dye may be used to form the compositions of the various embodiments. Suitable leuco dyes may comprise fluorans, phthalides, amino-triarylmethanes, aminoxanthenes, aminothioxanthenes, amino-9,10-dihydroacridines, aminophenoxazines, aminophenothiazines, aminodihydrophenazines, aminodiphenylmethanes, aminohydrocinnamic acids (cyanoethanes, leuco methines) and corresponding esters, 2(p-hydroxyphenyl)4,5-diphenylimidazoles, indanones, leuco indamines, hydrozines, leuco indigoid dyes, amino-2,3-dihydroanthraquinones, tetrahalo-p,p'-biphenols, 2(p-hydroxyphenyl)-4,5-diphenylimidazoles, phenethylanilines, and mixtures thereof.

In some embodiments, the leuco dye can be a fluoran, phthalide, aminotriarylmethane, or mixture thereof. Several examples of suitable fluoran based leuco dyes comprise 3-diethylamino-6-methyl-7-anilinofluorane, 3-(N-ethyl-p-toluidino)-6-methyl-7-anilinofluorane, 3-(N-ethyl-N-isoamylamino)-6-methyl-7-anilinofluorane, 3-diethylamino-6-methyl-7-(o,p-dimethylanilino)fluorane, 3-pyrrolidino-6-methyl-7-anilinofluorane, 3-piperidino-6-methyl-7-anilinofluorane, 3-(N-cyclohexyl-N-methylamino)-6-methyl-7-anilinofluorane, 3-diethylamino-7-(m-trifluoromethylanilino) fluorane, 3-dibutylamino-6-methyl-7-anilinofluorane, 3-diethylamino-6-chloro-7-anilinofluorane, 3-dibutylamino-7-(o-chloroanilino) fluorane, 3-diethylamino-7-(o-chloroanilino)fluorane, 3-di-n-pentylamino-6-methyl-7-anilinofluoran, 3-di-n-butylamino-6-methyl-7-anilinofluoran, 3-(n-ethyl-n-isopenty-lamino)-6-methyl-7-anilinofluoran, 3-pyrrolidino-6-methyl-7-anilinofluoran, 1(3H)-isobenzofuranone, 4,5,6,7-tetrachloro-3,3-bis[2-[4-(dimethylamino)phenyl]-2-(4-methoxyphenyl)ethenyl], and mixtures thereof. Aminotriarylmethane leuco dyes can also be used, for example, tris(N,N-dimethylaminophenyl) methane (LCV); deutero-tris(N,N-dimethylaminophenyl)methane (D-LCV); tris(N,N-diethylamino-phenyl) methane (LECV); deutero-tris(4-diethylaminolphenyl) methane (D-LECV); tris(N,N-di-n-propylaminophenyl) methane (LPCV); tris(N,N-di-n-butylamino-phenyl) methane (LBCV); bis(4-diethylaminophenyl)-(4-diethylamino-2-methyl-phenyl) methane (LV-1); bis(4-diethylamino-2-methylphenyl)-(4-diethylamino-phenyl) methane (LV-2); tris(4-diethylamino-2-methylphenyl) methane (LV-3); deutero-bis(4-diethylaminophenyl)-(4-diethylamino-2-methylphenyl) methane (D-LV-1); deutero-bis(4-diethylamino-2-methylphenyl)(4-diethylaminophenyl) methane (D-LV-2); bis(4-diethylamino-2-methylphenyl)(3,4-dimethoxyphenyl) methane (LB-8); aminotriarylmethane leuco dyes having different alkyl substituents bonded to the amino moieties wherein each alkyl group is independently selected from C1-C4 alkyl; and aminotriaryl methane leuco dyes with any of the preceding named structures that are further substituted with one or more alkyl groups on the aryl rings wherein the latter alkyl groups are independently selected from C1-C3 alkyl. Additional examples of thermochromic materials may include Spiro compounds.

Upon heat-induced oxidation, protonation, and/or ring-opening (in the presence of the unprotected activator) leuco dyes can form dyes having a variety of optical characteristics. The color forming composition of at least some embodiments may comprise at least about 3% by weight of leuco dye, and in more detail, can be present at from about 4% and about 20% by weight. These ranges are only exemplary and other weight ranges can be used, depending on the desired image characteristics and other considerations.

Liquid Carrier

Liquid carriers or binders suitable for use in some embodiments of the present invention comprise materials capable of forming a matrix with the color forming composition. Suitable liquid carriers comprise solvents and surfactants that are compatible with a particular leuco dye and other ingredients chosen for use. For example, suitable solvents may be selected from the group consisting of low-melting fatty acids, amides and alcohols. Low-melting is herein defined as melting at 110° C. or lower. In some embodiments, the solvent may comprise a hydrophobic, non-volatile solvent.

Suitable binders may comprise polymeric materials such as polyacrylate from monomers and oligomers, polyvinyl alcohols, polyvinyl pyrrolidines, polyethylenes, polyphenols or polyphenolic esters, polyurethanes, acrylic polymers, and mixtures thereof.

In some embodiments, the color forming composition can be prepared in solution, using a substantially transparent or translucent liquid carrier. The activator can be admixed within the solution or coated onto the substrate either before or after the solution is coated thereon.

In order to provide desirable color forming properties, various factors such as viscosity and solids content can be considered. The color forming compositions of some embodiments may have less than about 10% by weight of solids. For example, in one aspect, the solids content of a spin-coatable coating composition can be about 7% by weight.

Matrix Components

In some embodiments in which an activator and a color former (e.g., leuco dye) are held in separate phases in a matrix, the matrix, by way of example only, may be a UV curable lacquer such as acrylate derivatives, oligomers and monomers, with or without a photo package. A photo package may include a light absorbing species which initiates reactions for curing the lacquer, such as, by way of example only, benzophenone derivatives, free radical polymerization monomers and pre-polymers such as thioxanethane derivatives, anthraquinone derivatives, acetophenones and benzoine ether types. An example of a lacquer or matrix may include Nor-Cote CDG000 (a mixture of UV curable acrylate monomers and oligomers) (available from Nor-Cote Int'l. Inc., Crawfordsville, Ind.) which contains a hydroxyl ketone photoinitiator and organic solvent acrylates (e.g., methyl methacrylate, hexyl methacrylate, beta-phenoxy ethyl acrylate and hexamethylene acrylate). Other lacquers may include acrylated polyester oligomers such as CN293 and CN294 (available from Sartomer Co., Exton, Pa.).

Optional Ingredients

It can sometimes be desirable to add a plasticizer to improve coating flexibility, durability, and coating performance. Plasticizers can be either solid or liquid plasticizers. If the color forming composition and/or absorber is applied in multiple layers, the plasticizer and binder can be included in any of the individual liquid carriers.

Stabilizing agents can also be included in the color forming compositions, or in an adjacent layer. Several examples of suitable stabilizing agents may comprise a polyhydroxybenzophenone, hydroxylamine, triarylimidazole, hydroxyphenylbenzotriazole, and mixtures thereof.

Other variations can also be implemented, including the adding of a non-leuco colorant to impart additional desired color to the image. For example, the use of an opacifier pigment or other non-leuco colorant can be used to provide background color to the substrate. The non-leuco colorants can be added to the color forming composition, as long as the development of the leuco dye is not prevented from at least some development due to the presence of the optional colorant. In other embodiments, if a colored background is desired that will remain independent of leuco dye development, an opacifier pigment, other pigment, and/or dye can be admixed in the carrier to impart the desired color. Examples of opacifiers may comprise calcium carbonate, and/or titanium dioxide.

Various additional components, such as lubricants, surfactants, and materials imparting moisture resistance, can also be added to provide mechanical protection to the color forming composition. Other overcoat compositions can also be used and are well known to those skilled in the art.

EXAMPLE APPLICATION

Figure 1:
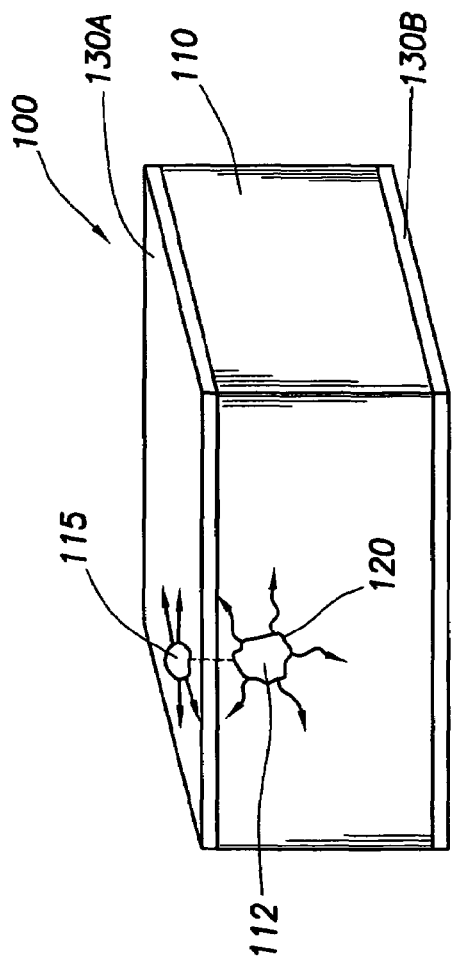
FIG. 1 shows a schematic packaging assembly according to embodiments of the invention.

Referring now to FIG. 1, there is shown an assembly 100 comprising surface 110, energy 120, and thermochromic coating composition 130. As illustrated, the thermochromic coating composition 130 may be placed over a top of the assembly 100 (coating composition 130A), a bottom of assembly 100 (coating composition 130B), or both. Surface 110 may be any surface upon which it is desirable to detect a change in temperature (e.g., a printed circuit board).

In production of coating composition 130, the color forming composition and liquid carrier may be melted together and cooled to yield a desired colored coating. The color forming composition may be encapsulated to protect the composition in subsequent applications (i.e., applying to substrate). Encapsulation may be performed by coacervation or interfacial polymerization. The color forming composition made in accordance with embodiments of the present invention may be sensitive such that switching of color occurs over a few degrees (e.g., 10 degrees or less) change in temperature. Microencapsulated inks available from American Thermal Instruments, Inc. of Dayton, Ohio and temptell inks available from Sherwood Technology Ltd. of Nottingham, England may be acceptable inks for use in some embodiments of the current invention. Variable switching of temperature may be achieved by choice of cosolvent. Additionally, the present compositions enjoy a wide choice of color including yellow, red, blue, green and black. In some embodiments, coating composition may indicate temperature increases for temperatures up to about 200° C. Further still, the coating composition may indicate whether a component's temperature is near a critical temperature or has or exceeded a critical temperature. For example, coating composition may indicate the glass transition temperature ($T_g$) of a printed circuit board by changing color at a temperature slightly lower than $T_g$.

Thermochromic coating composition 130 may be applied to the substrate 110 by any of a variety of methods, for example, flow coating, dipping and spraying. Flow coating may be accomplished by coaters such as a bar coater, a spin coater, a knife coater, a blade coater, a curtain coater, a gravure coater and a spray coater. The coating thickness (thickness before drying) may be approximately 1 mil to 10 mils and can optionally be set according to selection of the coating method. In some embodiments, the thermochromic coating composition may be applied to the top and/or bottom of a substrate prior to installation of the electronic components on the substrate. In yet other embodiments, the thermochromic coating may be applied after installation of the electronic components, for example, by spraying the thermochromic composition on the bottom of the substrate (with the electronic components on the top), or by spraying the thermochromic composition over the electronic components.

Still referring to FIG. 1, a portion of the assembly 100 may experience an area of localized temperature variation, such as a temperature increase shown as area 115. The area of localized temperature increase 115 may be caused by hot spots within the substrate 110, such as area 112. Alternatively, areas of localized temperature increase, such as area 115, may be caused by electronic components (not specifically shown) mounted on the same side of the assembly 100, or on the opposite side of the assembly 100. Regardless of the precise reason for the area of localized temperature increase, the thermochromic coating composition 130 may indicate the areas of localized temperature increase by a change of color. Further, and as indicated by the arrows associated with areas 112 and 115, the areas of localized temperature increase may tend to grow in area and/or volume if the heat source remains active.

FIG. 2 illustrates a flow diagram in accordance with some embodiments of the invention. In particular, the process may start (block 200) and proceed to applying a thermochromic coating composition to a substrate (block 210). After the coating is applied, electronic devices or components mounted on the substrate may be operated (block 220). Areas of increased thermal activity, resulting in areas of localized temperature increase, may be identified by color changes in the thermochromic coating composition (block 230). Thereafter, the process may end (block 240).

Application of the thermochromic coating composition (block 210), in some embodiments, takes place prior to installation of the electronic devices and components on the substrate. In alternative embodiments, the thermochromic coating composition may be applied after installation of the electronic components (e.g., on a back surface of the substrate).

Figure 3:
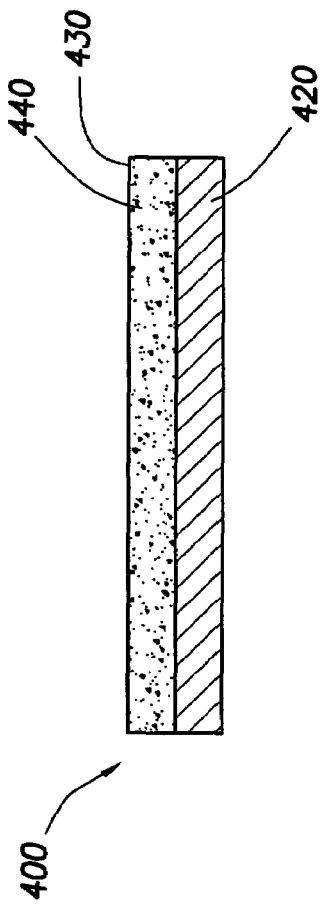
FIG. 3 shows a second schematic drawing in accordance with embodiments of the invention.

Referring now to FIG. 3, there is shown assembly 400 comprising a circuit board 420, the matrix 430 (comprising the activator and the dye), and suspended particles 440. As portions of circuit board 420 become heated (e.g., due to overheating circuit or electrical component) suspended particles 440 reach a temperature sufficient to cause the interdiffusion of the color forming species initially present in the particles (e.g., glass transition temperatures ($T_g$) or melting temperatures ($T_m$) of particles 440 and matrix). The activator and dye may then react to form a color, indicating the heat radiated from the circuit or electrical component.

One method of preparing a lacquer/dye/activator solution may be to dissolve the activator (e.g., bisphenol-A) into melted dibenzyl oxalate, cool and grind that mixture into a fine powder. The powder may then be dissolved in a UV curable lacquer (e.g., Nor-Cote CDG000). Then, a leuco dye (e.g., BK-400 with average particle size <5 μm) may be mixed into form a lacquer/activator/leuco dye solution. The solution may then be applied to the chip or IC and cured by UV lamp. If it is desired to control the temperature at which color change will occur, it may be desirable to include other components in the melted dibenzyl oxalate, e.g., m-terphenyl or alcohols melting between 50° C. and 80° C. By controlling the relative composition of the melt (i.e., the dibenzyl oxalate melt), it may be possible to control the temperature at which a color change occurs.

Figure 4:
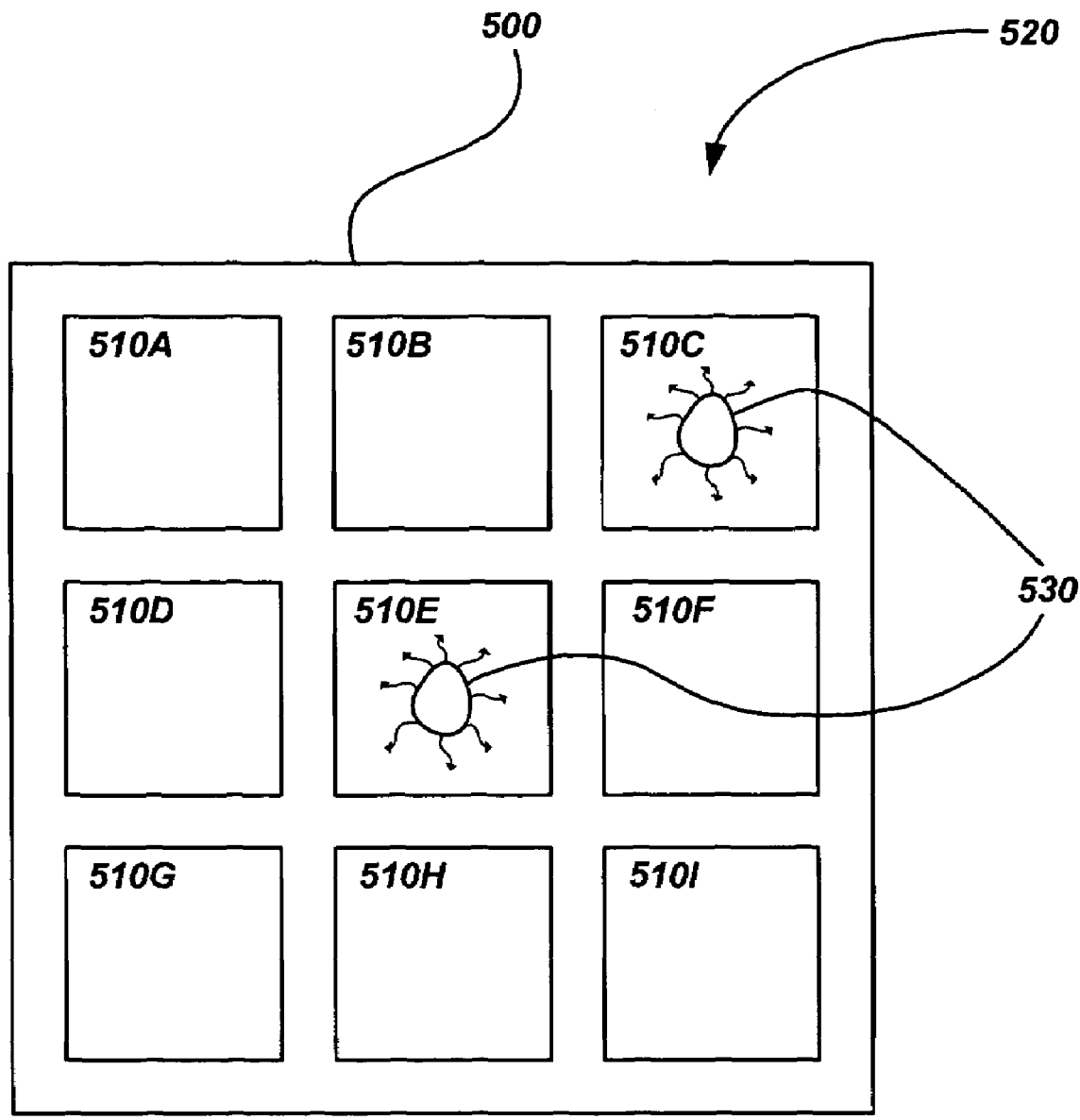
FIG. 4 shows a third schematic drawing in accordance with embodiments of the invention.

Referring now to FIG. 4, there is shown a circuit board assembly 520 comprising a circuit board 500 upon which electrical devices 510 (e.g., circuits) are mounted. The electrical devices 510 are coated with a thermochromic coating composition (such as reference number 130 in FIG. 1). Upon the localized overheating of an electrical device (e.g., overheating of circuit 510E or 510C), localized color changes 530 occur. It may be desirable to include multiple color formers such that if two areas of localized overheating are of different magnitude (e.g., the localized heating on circuits 510C and 510E) then the type of color change may be different.

EXAMPLES

The following examples illustrate embodiments of the invention. However, it is to be understood that the following is only exemplary or illustrative of embodiments of the present invention. Numerous modifications and alternative compositions, methods, and systems may be devised without departing from the spirit and scope of the present invention. For example, thermochromic compositions may be thermochromically reversible or irreversible (permanent). Additionally, when using thermochromically permanent compositions, the user may apply the composition to the substrate (e.g., circuit board) after manufacturing. Further, it is contemplated that compositions may be incorporated into components during manufacture including, but not limited to, solder mask and the circuit board itself.

Example 1

A dispersion of fluoran dye BK400 (available from Nagase), Bisphenol A, Bisphenol S, and CDG000 UV curable matrix (available from Norcote Inc.) was prepared. The matrix contained hydroxy ketone as a photoinitiator and organic solvent acrylates (methyl methacrylate, hexyl methacrylate, beta-phenoxy ethyl acrtrylate, hexamethylene actrylate and solvents). The color forming dispersion was applied to a glass substrate and cured with UV radiation. The glass was heated at gradual temperature ramping. The color forming dispersion showed no change in color to 80° C., but showed a sharp color change at 140° C.

Example 2

A dispersion of fluoran dye BK400 (available from Nagase), Bisphenol A, Bisphenol S, and CN 293 and CN 294 curable matrix (available from Sartomer) was prepared. The color forming dispersion was applied to a glass substrate and cured with UV radiation. The glass was heated at gradual temperature ramping. The color forming dispersion showed no change in color to 80° C., but showed a sharp color change at 140° C.

Example 3

A dispersion of fluoran dye S-205, 2-hydroxy-1-aminopropanol, acetyl TG-SA, cellulose butyl acetate with the balance being methylethyl ketone was prepared. The color forming dispersion was applied to a glass substrate and cured with UV radiation. The glass was heated at gradual temperature ramping. Upon heating to approximately 120° C., the color forming dispersion developed intense color.

Without wishing to be bound by any particular theory, it is believed that an acyl transfer reaction between an acyl protected phenol and an amine produced the intense color formation of Example 3. This reaction is illustrated in the following reaction scheme:

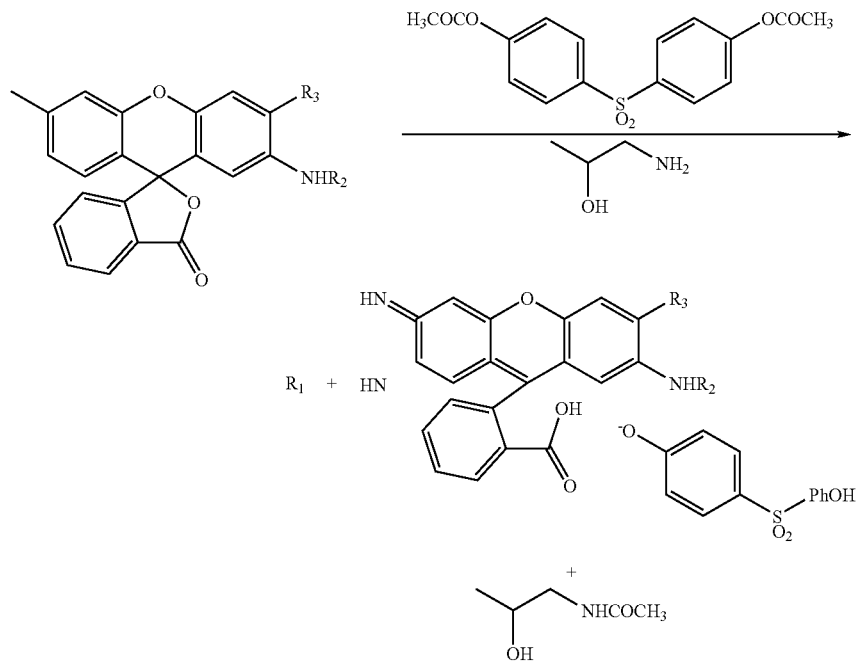

It is envisioned that the examples disclosed herein can be prepared using encapsulated inks.

Potentially, the ester amine reactivity may be tailored to react at specific temperatures, providing compositions as temperature-sensitive as desired, e.g., switching of color may occur over a few degrees (e.g., 10 degrees) change in temperature.

What is claimed is:

1. A system comprising:
   a circuit board; and
   a thermochromic coating covering at least a portion of the circuit board,
      wherein the thermochromic coating indicates areas of increased temperature on the circuit board; and
      wherein the thermochromic coating comprises
         a color forming leuco dye; and
         an activator having at least one acid group, wherein the thermochromic coating is a matrix and the activator and the leuco dye are substantially uniformly distributed in the matrix in separate phases.

2. The system of claim 1 wherein the activator comprises at least one functional group selected from the group consisting of hydroxyl, thio, and amine groups, and wherein the at least one functional group acts as a Lewis acid.

3. The system of claim 1 wherein the activator is selected from the group consisting of phenols, carboxylic acids, cyclic sulfonamides, protonic acids, and mixtures thereof.

4. The system of claim 1 wherein the color forming leuco dye is selected from the group consisting of fluorans, phthalides, aminotriarylmethanes, and mixtures thereof.

5. The system of claim 1 wherein the thermochromic coating is encapsulated.

6. The system of claim 1 wherein the thermochromic coating indicates a first area of increased temperature with a first color and indicates a second area of increase temperature with a second color.

7. The system of claim 1 wherein at least one of the acid group is protected by a protection leaving group to form a protected activator and further comprising a deprotecting agent configured to remove the protection leaving group from the activator upon application of energy.

8. The system of claim 7 wherein the protected activator is selected from the group consisting of esters, sulfonates, ethers, phosphinates, carbonates, carbamates, and mixtures thereof.

9. The system of claim 7 wherein the protection leaving group is an acyl selected from the group consisting of formate, acetate, levulinate, pivaolate, and mixtures thereof.

10. The system of claim 7 wherein the deprotecting agent is selected from the group consisting of valoneol, prolinol, 2-hydroxy-1-amino-propanol, 2-amino-3-phenyl-1-propanol, (R)-(−)-2-phenyl glycinol, 2-amino-phenylethanol, 1-naphthylethyl amine, 1-aminonaphthalene, morpholin, and mixtures thereof.

11. A method comprising:
   applying a coating to a substrate, the coating comprising
      a color forming leuco dye; and
      an activator having at least one acid group;
   operating electrical devices mounted on the substrate; and
   identifying areas of increased thermal activity based on color changes of the coating, wherein the leuco dye and the activator are substantially uniformly distributed in a matrix in separate phases.

12. The method of claim 11 wherein activator comprises at least one functional group selected from the group consisting of hydroxyl, thio, and amine groups, and wherein the at least one functional group acts as a Lewis acid.

13. The method of claim 11 wherein the activator is a member selected from the group consisting of phenols, carboxylic acids, cyclic sulfonamides, protonic acids, and mixtures thereof.

14. The method of claim 11 wherein the color forming leuco dye is selected from the group consisting of fluorans, phthalides, aminotriarylmethanes, and mixtures thereof.

15. The method of claim 11 wherein identifying areas of increased thermal activity further comprises identifying color change of the coating resulting from the coating undergoing a phase change in response to heat from the substrate.

16. The method of claim 11 wherein one of the leuco dye and the activator is dissolved in the matrix.

17. The method of claim 11 wherein the activator is protected by a protection leaving group to form a protected activator and wherein the coating further comprises a deprotecting agent configured to remove the protection leaving group from the activator upon application of energy.

18. The method claim 17 wherein the protected activator is a member selected from the group consisting of esters, sulfonates, ethers, phosphinates, carbonates, carbamates, and mixtures thereof.

19. The method of claim 17 further comprising applying the coating wherein the protection leaving group is an acyl selected from the group consisting of formate, acetate, levulinate, pivaolate, and mixtures thereof.

20. The method of claim 17 further comprising applying the coating wherein the deprotecting agent is a member selected from the group consisting of valoneol, prolinol, 2-hydroxy-1-amino-propanol, 2-amino-3-phenyl-1-propanol, (R)-(−)-2-phenyl glycinol, 2-amino-phenylethanol, 1-naphthylethyl amine, 1-aminonaphthalene, morpholin, and mixtures thereof.

21. A circuit board comprising:
   a substrate;
   a plurality of electrical components mounted on the substrate; and
   a thermochromic coating on the substrate, wherein the thermochromic coating comprises a color forming leuco dye and an activator having at least one acid group, wherein the thermochromic coating is a matrix and the activator and the leuco dye are substantially uniformly distributed in the matrix in separate phases.

22. The circuit board of claim 21 wherein at least one of the acid groups is protected by a protection leaving group to form a protected activator and further comprising a deprotecting agent configured to remove the protection leaving group from the activator upon application of energy.

* * * * *

UNITED STATES PATENT AND TRADEMARK OFFICE
CERTIFICATE OF CORRECTION

PATENT NO. : 7,513,682 B2  Page 1 of 1
APPLICATION NO. : 10/842831
DATED : April 7, 2009
INVENTOR(S) : Linden H. McClure et al.

It is certified that error appears in the above-identified patent and that said Letters Patent is hereby corrected as shown below:

In column 11, lines 14-25, delete

" 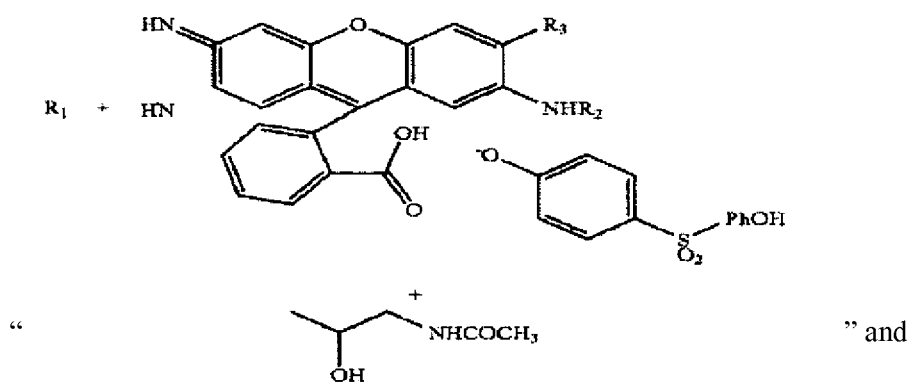 " and insert -- 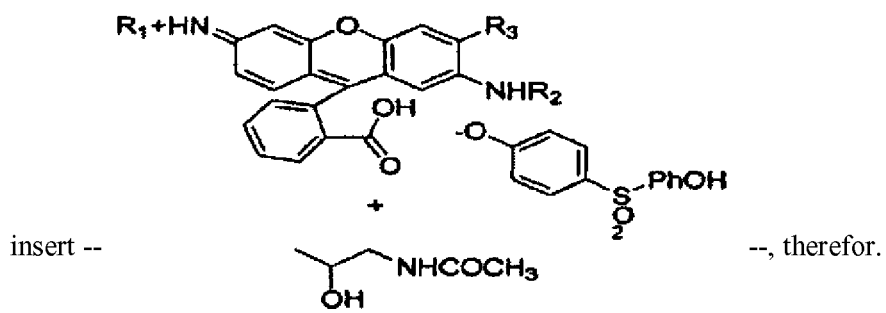 --, therefor.

Signed and Sealed this

Fifteenth Day of September, 2009

David J. Kappos
*Director of the United States Patent and Trademark Office*